United States Patent [19]

Jacobs

[11] 4,249,582

[45] Feb. 10, 1981

[54] METHOD AND APPARATUS FOR FORMING ELECTRICAL LEADS FOR RETENTION IN PRINTED CIRCUIT BOARDS

[75] Inventor: Joseph M. Jacobs, Berwyn, Ill.

[73] Assignee: Zenith Radio Corporation, Glenview, Ill.

[21] Appl. No.: 76,645

[22] Filed: Sep. 18, 1979

[51] Int. Cl.³ .............................................. B21F 1/00
[52] U.S. Cl. ................................................... 140/105
[58] Field of Search .................. 140/104, 105; 72/384, 72/387, 388

[56] References Cited

U.S. PATENT DOCUMENTS

| | | | |
|---|---|---|---|
| 3,841,361 | 10/1974 | Kieronski | 140/104 X |
| 4,026,333 | 5/1977 | Keller | 140/105 |

*Primary Examiner*—Richard B. Lazarus
*Attorney, Agent, or Firm*—Ralph E. Clarke, Jr.

[57] ABSTRACT

A method is disclosed for the temporary retention of insulated electrical leads by a printed circuit board preparatory to permanent electrical and mechanical attachment. Also disclosed is apparatus for forming the leads for said retention. The lead has a metallic wire therethrough with a residuum of elasticity. The printed circuit board consists of an insulative sheet with a plurality of selectively interconnected metallic electrical terminals each having a hole therethrough smaller in diameter than the outside diameter of the electrical lead, but larger in diameter than the wire by a factor of appreciably greater than 2. The method according to the invention comprises stripping the insulation from an end of the lead to provide a predetermined length of wire projecting from the abutment of the insulation formed by the stripping. The wire is then folded to form a narrow J-hook, the folded width of which is appreciably greater than the diameter of the hole. The point of the fold is selected such that the distance between the tip of the wire and the abutment of the insulation is substantially equal to the thickness of the board. The tip of the wire is offset to form a spur. When the retentive configuration is inserted into the hole, the J-hook is constricted to provide entry into the hole and thereafter, because of its residuum or elasticity, expands. The abutment of the insulation limits the distance of entry of the wire into the hole, and the spur, together with the expansion of the J-hook, inhibits withdrawal of the lead from the hole.

1 Claim, 15 Drawing Figures

METHOD AND APPARATUS FOR FORMING ELECTRICAL LEADS FOR RETENTION IN PRINTED CIRCUIT BOARDS

BACKGROUND OF THE INVENTION AND PRIOR ART STATEMENT

This invention relates, in general, to manufacturing processes for electronic components, and more specifically, to an improvement in retaining insulated electrically conductive wires in what are commonly termed "printed circuit boards" preparatory to soldering. Printed circuit boards commonly comprise a board of insulative material having a thickness of about 1/16th of an inch. On at least one surface of the board is printed or otherwise impressed a plurality of terminal points consisting of a conductive material having a hole therethrough. The terminal points in turn are selectively interconnected by conductors commonly overlaid with an insulative substance. The holes may differ in diameter to accommodate wire of different gauges.

It is common practice to attach a lead to a printed circuit board terminal by removing the insulation from the tip of the lead, inserting the wire member in the desired hole, and crimping or otherwise deforming it so that it cannot easily be withdrawn from the hole. The retention is intended to be a temporary expedient, as the permanent electrical connection and mechanical attachment of the wire to the terminal is made by a soldering process, such as by dipping or wave-soldering.

A typical printed circuit board may have a great many terminals to which wires must be attached. Inserting the wires by hand and manually forming the protruding ends for retention by tool means such as pliers is a timely-consuming, labor-intensive process, and consequently high in cost.

Prior art means for providing for wire retention by printed circuit board terminals include the process of die-cutting of the tip of the wire and upsetting or partially cutting the wire to form a barbed hook which when inserted into terminal hole, inhibits withdrawal. The malformation due to the cutting of the wire by this process can result in the breaking of the wire. It is also known in the art to form the wire tip in serpentine configuration to inhibit lead withdrawal.

Another prior art means comprises the attachment of a preformed barbed connector to the wire tip as by crimping; the barbed connector, when inserted into the terminal hole, similarly inhibits withdrawal. The use of such a connector appreciably adds to the cost of manufacture because of the additional process steps of attaching the connector to the wire, and the cost of the connector itself.

Worth et al in U.S. Pat. No. 2,932,859 discloses means for making electrical connections between circuit components and circuits of the printed type. Shown are leads affixed to the rearward side of the printed panel by passing their wiring leads through holes in the panel and crimping them against the printed pattern terminal connections. Following the crimping operation such panels are dipped into a soldering bath to solder the crimped leads in place.

OBJECTS OF THE INVENTION

1. It is a general object of this invention to provide for the facilitating of the assembly of printed circuit boards.
2. It is a less general object of the invention to provide an improved method for the temporary retention of electrical leads to printed circuit boards prior to soldering, and to provide apparatus for forming leads for such retention.
3. It is a more specific object of the invention to provide improvements productive of more effective temporary retention of electrical leads with minimum cost and with minimum training of the operators.

BRIEF DESCRIPTION OF THE DRAWINGS

The features of the present invention which are believed to be novel are set forth with particularity in the appended claims. The invention, together with further objects and advantages thereof, may best be understood by reference to the following description taken in conjunction with the accompanying drawings, in the several figures of which like reference numerals identify like elements, and in which:

DESCRIPTION OF THE PREFERRED EMBODIMENT

Figure 1:
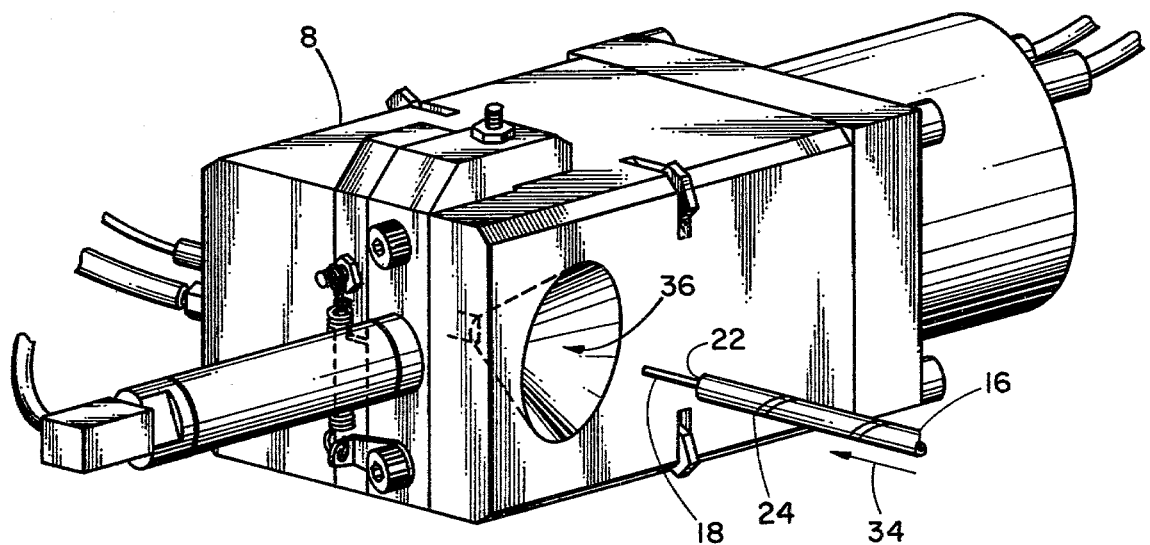
FIG. 1 is a view in perspective of a wire forming apparatus useful in forming a wire-retaining configuration of an electrical lead according to the invention.
Figure 2:
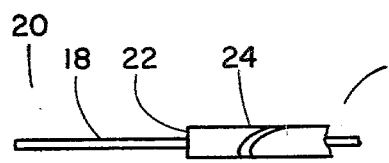
FIG. 2 is a view of a fragment of an insulated electrical lead having the insulation stripped from an end thereof.
Figure 3:
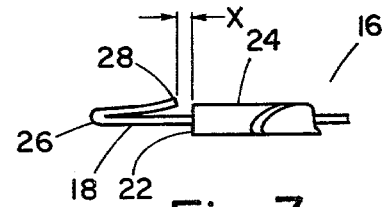
FIG. 3 is a view similar to FIG. 2 showing a step in the method of forming, according to the invention, a retentive J-hook configuration on an end of an insulated electrical lead.

FIG. 1 is a view of a wire forming apparatus 8 embodying means providing for the forming of the wire component of electrical leads for retention is in printed circuit boards according to the invention. Before describing the apparatus, the method according to the invention of forming such leads is described to facilitate understanding.

With reference now to FIGS. 2–5, there is disclosed a method of forming a J-hook on an end of an insulated electrical lead with a metallic wire therethrough having a residuum of elasticity. The J-hook provides for the temporary retention of the lead by a printed circuit board preparatory to permanent electrical and mechanical attachment to the board as by soldering. A printed circuit board 10 is shown as a fragment in FIGS. 4 and 5; the board may consist of an insulative sheet of a predetermined thickness on which is printed or otherwise impressed a plurality of selectively interconnected metallic electrical terminals 12 each having a hole 14 therethrough. Hole 14 is smaller in diameter than the outside diameter of electrical lead 16, but larger in diameter than the metallic wire 18 by a factor of appreciably greater than two.

Figure 5:
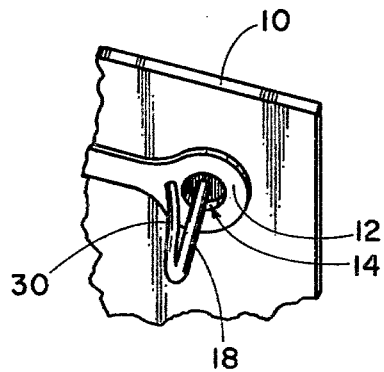
FIG. 5 is a view in perspective and in elevation of a printed circuit board showing the retentive configuration according to the invention as installed in a printed circuit board.
Figure 4:
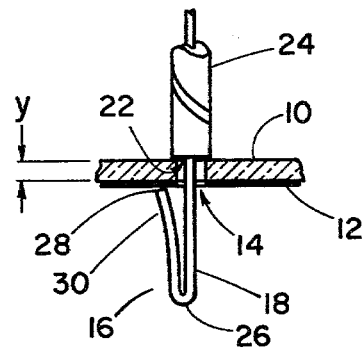
FIG. 4 is a view in elevation and partially in section of a retentive configuration formed by the method according to the invention.

The method according to the invention of forming the J-hook comprises stripping the insulation from an end 20 of lead 16 to provide a predetermined length of wire 18 projecting from an abutment 22 of the insulation 24; abutment 22 is formed by the stripping operation. Wire 18 is then folded to form a narrow J-hook, the folded width of which is appreciably greater than the diameter of hole 14. The point 26 of the fold is selected such that the distance bwtween the tip 28 of the wire and abutment 22 is substantially equal to the thickness of board 10, indicated as having a thickness Y. The relative dimensions of the members are indicated by FIG. 5. The tip 28 of wire 18 is then offset to form a spur 30.

The effect is such that when the J-hook produced by the method according to the invention is inserted into hole 14, the J-hook is constricted to provide entry into hole 14 and thereafter expands because of the residuum of elasticity of wire 18. The abutment 22 of the insulation 24 limits the distance of entry of wire 18 into hole 14. Spur 30, together with the expansion of the J-hook, inhibits withdrawal of lead 16 from hole 14. Thus the J-hook provides for temporary retention of lead 16 by printed circuit board 10 preparatory to permanent mechanical and electrical attachment to board 10.

It is a well-known, desirable characteristic that the wire component of electrical leads be readily yielding and conformable to terminals and other hook-up points for attachment such as by wrapping, crimping or other. However, there yet remains in any such wire component a residuum of elasticity, or "springiness" useful in the present invention. While the characteristics of the wire are far from resembling a true spring, there is enough latent elasticity in the wire that when the J-hook-shaped wire is constricted upon entry into the hole of the printed circuit board, it will expand after it goes through the hole to a degree adequate to provide the desired retention of the lead according to the invention.

The essential functions of the apparatus according to the invention for forming a J-hook will now be described with reference to FIGS. 1, 5 and 5A-D. FIG. 1 shows entry means 36 which provides for insertion of electrical lead 16 into a wire-forming station in apparatus 8. The metallic wire 18 of lead 16 projects a predetermined length from an abutment 22 of the insulation 24 of lead 16 formed by a stripping process.

Figure 5A:
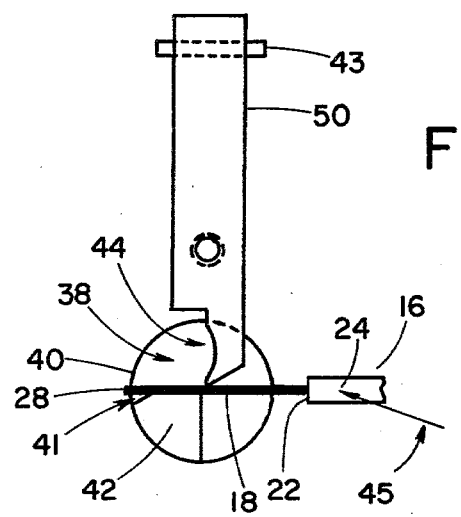
FIGS. 5A, 5C and 5D are schematic views showing in sequence the forming of the retentive configuration according to the invention.

With reference now to FIG. 5A, wire 18 is shown in the wire-forming station as lying substantially diammetrically to the face 38 of a rotary forming die 40, and adjacent to the plane of the face 38 of die 40. The tip 28 of wire 18 is shown as extending appreciably beyond the periphery of die 40. Rotary forming die 40 is shown in perspective in FIG. 5B.

Cradle means 42 are shown as extending from face 38 for receiving wire 18. Cradle means 42 has a chamfer 41 adjacent to the tip 28 of wire 18.

Anvil means 50 is suspended by pivot means 43 adjacent to the face 38 of die 40. Anvil means 50 has a wire-forming concavity 44 lying in the plane of wire 18 and substantially orthogonal to the axis of rotary forming die 40.

Wire clamping means 45, indicated symbolically by the arrow, is associated with entry means 36 for clamping wire 18 in the work station by pressure upon the insulation 24 of electrical lead 16.

Figure 5C:
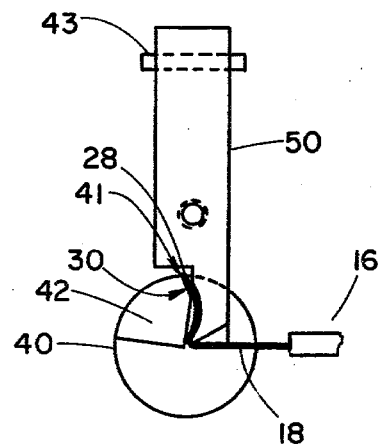

Means are provided for rotating rotary form die 40 from a first position shown by FIG. 5A to a second position shown by FIG. 5C to form an approximately 90° fold in wire 18. Cradle means 42 forces wire 18 into the wire forming concavity 44 of anvil 50. Chamfer 41 provides for the relief of the tip 28 of wire 18 from the force to form a spur 30 projecting outwardly from wire 18 on tip 28 of wire 18.

Means are provided for rotating anvil means 50 on pivot means 43 to retract anvil means 50 from the work station. Means are also provided for rotating rotary forming die 40 from the second position shown by FIG. 5C to a third position shown by FIG. 5D; anvil means 50 is shown as being completely withdrawn in FIG. 5D for purposes of clarity of illustration. It will be seen that, by the clockwise rotation of rotary forming die 40 and associated cradle 42, wire 18 is folded into a J-hook of narrow proportions, the folded width of which is slightly greater than the diameter of hole 14 in printed circuit board 10 shown by FIGS. 3 and 4.

Means are provided for releasing electrical lead 16 from wire clamping means 45, providing for withdrawal of lead 16 from the apparatus 8.

Means are further provided for returning rotary forming die 40 to the first position shown by FIG. 5A and restoring anvil means 50 to the work station. The apparatus is now ready to form another J-hook on an end of an electrical lead for retention by a printed circuit board.

FIGS. 6–11 comprise plan views selectively sectioned to show the location of the components that accomplish the essential functions described in the foregoing. Ancillary components are also shown and described, supplying information to those skilled in the art of machine design in the interest of more rapid implementation of the invention. The wire forming apparatus is depicted without incidental means of operation such as sources of compressed air and electricity—means which are well-known in the art and need no further expatiation.

FIG. 1 shows the aforedescribed insulated electrical lead 16 in movement as indicated by arrow 34 toward the funneled entrance port of entry means 36 of wire-forming apparatus 8, details of which are shown by FIGS. 6–11. As described heretofore, the insulation 24 has previously been stripped from the end of lead 16 to provide a predetermined length of wire 18 projecting from the abutment 22 of insulation 24 as formed by the stripping process.

Figure 6:
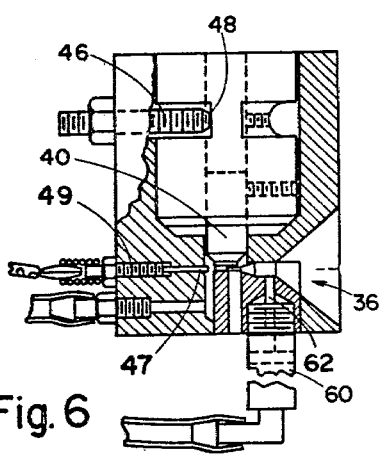
FIGS. 6–8 are various plan views selectively sectioned to show the location of major components of the wire forming apparatus shown by FIG. 1.

Reference is now made to FIG. 6, which is a plan view of the wire-forming apparatus 8 showing a partial section of the plane of rotation of rotary forming die 40 and associated parts in the work station. External to wire forming apparatus 8 are manually controllable adjustment components including electrical bridge sensor 47 which, together with set screw 49, controls the distance of entry of lead 18 into the work station.

The bending point 26 of wire 18 is determined by the setting of set screw 49. Set screw 49, together with the associated electrical bridge sensor 47, serve to establish the location of wire 18 such that the distance "X" (see FIG. 3) between tip 28 of wire 18 and the abutment 22 of insulation 24 is appreciably greater than the thickness "Y" of the printed circuit board 10.

Figure 7:
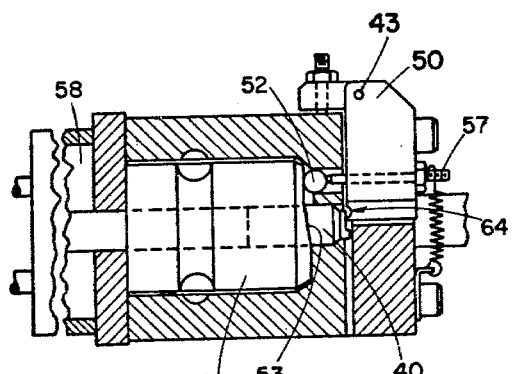
Figure 8:
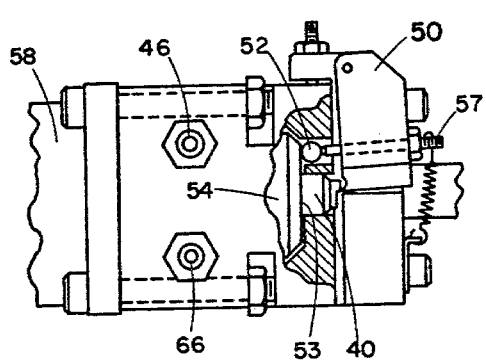

FIG. 7 is an elevation view of a section taken through the axis of rotation of rotary forming die 40. Anvil means 50 contains set screw 57 which, as will be noted, is in line with steel ball 52. Steel ball 52 is held captive by the annular recess in the housing of the wire forming apparatus 8. Steel ball 52 acts as a cam follower to transfer the rotary motion of the cam 53 located at the end of coupler 54. The effect is the retraction of anvil means 50 from the work station. FIG. 8 shows anvil means 50 when retracted.

Figure 9:
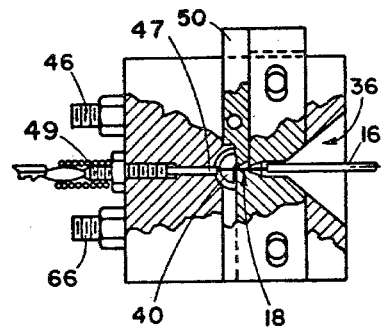
FIGS. 9–11 are views in elevation selectively partially sectioned showing the sequence in forming the retentive configuration on an end of an insulated electrical lead by the apparatus according to the invention.
Figure 10:
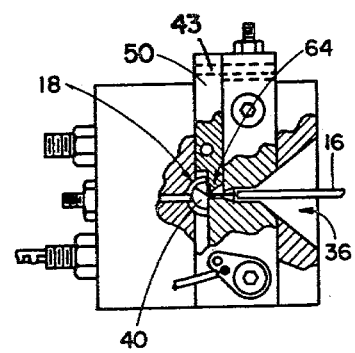
Figure 11:
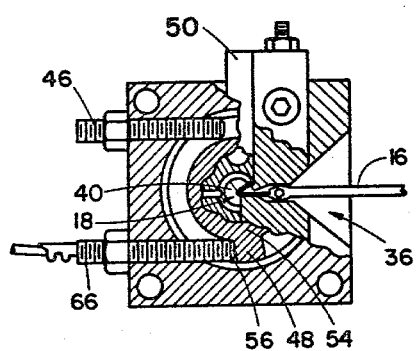

Now with reference also to FIGS. 9-11, the operation of the components shown in FIGS. 6-8 is described. FIG. 9, which is a view in elevation and partially in section taken in the plane of rotation of rotary forming die 40, shows electrical lead 16 in position in the work station—the FIG. 5A position—prior to the start of the forming operation. It will be seen that lead 16 is fully inserted into the port of entry means 36. With regard to the aforementioned "predetermined length" of wire 18 of lead 16, it will be seen that lead 16 has been stripped of its insulation to provide a length of wire 18 sufficient in length to span the diameter of rotary forming die 40 and make electrical contact with electrical bridge sensor 47. Electrical bridge sensor 47 is adjusted by setscrew 49 to provide the proper "X" distance as described heretofore.

Upon contact of the tip of wire 18 with electrical bridge sensor 47, an electrical circuit is created between sensor 47 and anvil means 50. The electrical impulse is routed to an electrical control system (not shown) which activates a solenoid air valve (also not shown), directing pressurized air to rotary air cylinder 58 which rotates rotary forming die 40. Linear air cylinder 60 clamps the insulated portion of lead 16 rigidly in place by pressure on lead 16 exerted through plunger 62. Rotary forming die 40 then rotates from a first position to a second position through approximately 90°; this rotation results in the "folding" of wire 18 heretofore described. As rotary forming die 40 rotates in response to the action of rotary air cylinder 58, the cradled wire is forced into the wire-forming concavity of anvil means 50, with the chamfer providing for the relief of the tip of the wire from the force to form the spur 30. This action is shown in detail in FIG. 5C.

With reference now to FIG. 10, wire 18 is shown at approximately 90° rotation in the second position wherein wire 18 is pressed against the wire forming concavity of anvil means 42, forming the spur 30. Anvil means 50 is then rotated on pivot means 43 to retract anvil means 50 from the work station by the interaction of the steel ball 52 riding the cammed end 53 of coupler 54. FIG. 8 shows in detail the anvil means 50 being pivoted away on pivot means 43 from the work station in which the wire is being formed. The extent to which anvil means 50 pivots out of the work station is controlled externally by setscrew 57, which engages steel ball 52.

Figure 5D:
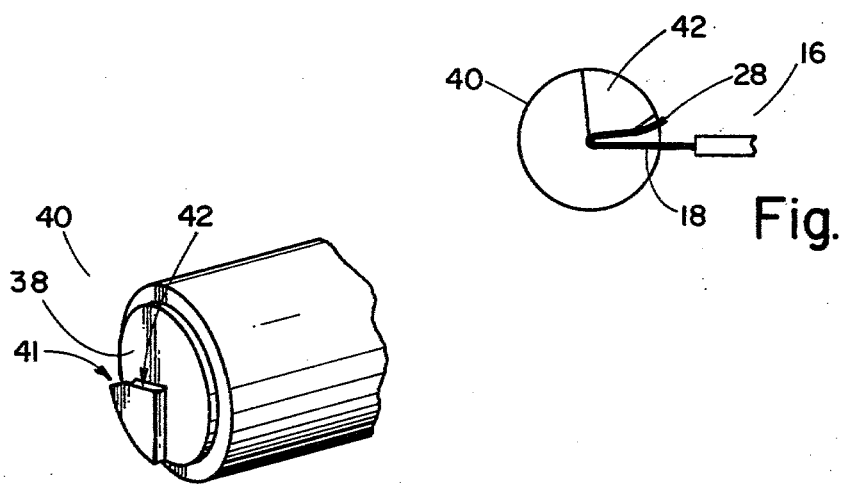
Figure 5B:
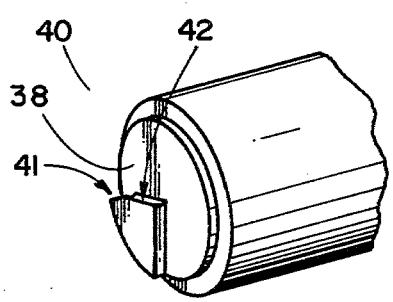
FIG. 5B is a detail view in perspective of a wire-forming member shown by various figures.

FIG. 11 shows segments of two planes of operation that reveal the corresponding portions of the moving parts at the completion of the forming operation (the action is shown in detail by FIG. 5D). The coupler travel limiting stop 48 of coupler 54 is shown as having engaged rotation limiting setscrew 66. The formation of the retentive J-hook configuration according to the invention is completed at this point. When coupler travel limiting stop 48 contacts rotation limiting setscrew 66, an electrical circuit is completed which concurrently reverses the rotation of rotary form 40 to the first position, and releases plunger 62 which has clamped electrical lead 16. Lead 16 can then be withdrawn from funneled entry port 36 with the retentive J-hook configuration according to the invention fully formed and ready for insertion in a hole in a printed circuit board. Air exhausted by the cylinders at the close of the operation is directed through the work station to remove fragments of copper or other contaminating material.

While particular embodiments of the invention and the method of formation have been shown and described, it will be obvious to those skilled in the art that changes and modifications may be made without departing from the invention in its broader aspects, and therefore, the aim of the appended claims is to cover all such changes and modifications as fall within the true spirit and scope of the invention.

I claim:

1. Apparatus for forming a J-hook on an end of an insulated electrical lead for retention of said lead by a printed circuit board having at least one hole therethrough in association with an impressed electrical terminal, the metallic wire of said lead projecting a predetermined length from an abutment of the insulation of said lead formed by a stripping process, said apparatus comprising in combination:

entry means providing for insertion of said lead into a wire forming station in said apparatus, said wire when in said station lying substantially diametrically to the face of a rotary forming die, and adjacent to the plane of the face of said die, with the tip of said wire extending appreciably beyond the periphery of said die;

cradle means extending from said face for receiving said wire, said cradle means having a chamfer adjacent to said tip of said wire;

anvil means suspended by pivot means adjacent to said face of said die, said anvil means having a wire forming concavity lying in the plane of said wire and substantially orthogonal to the axis of said rotary forming die;

wire clamping means associated with said entry means for clamping said wire in said work station;

means for rotating said die and said cradle from a first position to a second position to form an approximately 90° fold in said wire, said cradle forcing said wire into said concavity of said anvil, with said chamfer providing for the relief of said tip from said force to form a spur projecting outwardly from said wire on said tip of said wire;

means for rotating said anvil on said pivot means to retract said anvil from said work station;

means for rotating said die and said cradle to a third position to fold said wire into a narrow J-hook, the folded width of which is slightly greater than the diameter of said hole in said printed circuit board;

means for releasing said lead from said wire clamping means, providing for withdrawal of said lead from said apparatus;

means for returning said rotary forming die to said first position and restoring said anvil to said work station, whereupon said apparatus is ready to form another J-hook on an end of an electrical lead for retention by a printed circuit board.

* * * * *